United States Patent [19]
Paolella

[11] Patent Number: 5,073,718
[45] Date of Patent: Dec. 17, 1991

[54] OPTICAL CONTROL OF A MICROWAVE SWITCH

[75] Inventor: Arthur Paolella, Howell, N.J.

[73] Assignee: The United States of America as represented by the Secretary of the Army, Washington, D.C.

[21] Appl. No.: 604,081

[22] Filed: Oct. 15, 1990

[51] Int. Cl.$^5$ ............................................. G02B 27/00
[52] U.S. Cl. ................................. 250/551; 307/311; 250/214 DC
[58] Field of Search ............ 250/551, 214 R, 214 SW, 250/214 A, 227.11, 214 DC; 307/311, 117; 455/602, 612, 617

[56] References Cited

U.S. PATENT DOCUMENTS

| | | | |
|---|---|---|---|
| 4,369,371 | 1/1983 | Hara et al. | 250/551 |
| 4,570,079 | 2/1986 | Davis | 250/551 |
| 4,859,965 | 8/1989 | Paolella et al. | 330/285 |
| 5,001,355 | 3/1991 | Rosen et al. | 250/551 |
| 5,012,084 | 4/1991 | Guiberteau et al. | 250/551 |

Primary Examiner—David C. Nelms
Assistant Examiner—Michael Messinger
Attorney, Agent, or Firm—Michael Zelenka; Robert A. Maikis

[57] ABSTRACT

An optical switch control circuit for controlling a microwave switch using a single optical control link. The optical switch control circuit includes, a light source, a control connected to the light source, an optic fiber cable having an end coupled to the light source, a field effect transistor coupled to a second end of the optic fiber cable, an amplifier coupled to the field effect transistor, an analog to digital converter coupled to the amplifier, and a multi-bit microwave switch coupled to the analog to digital converter.

5 Claims, 1 Drawing Sheet

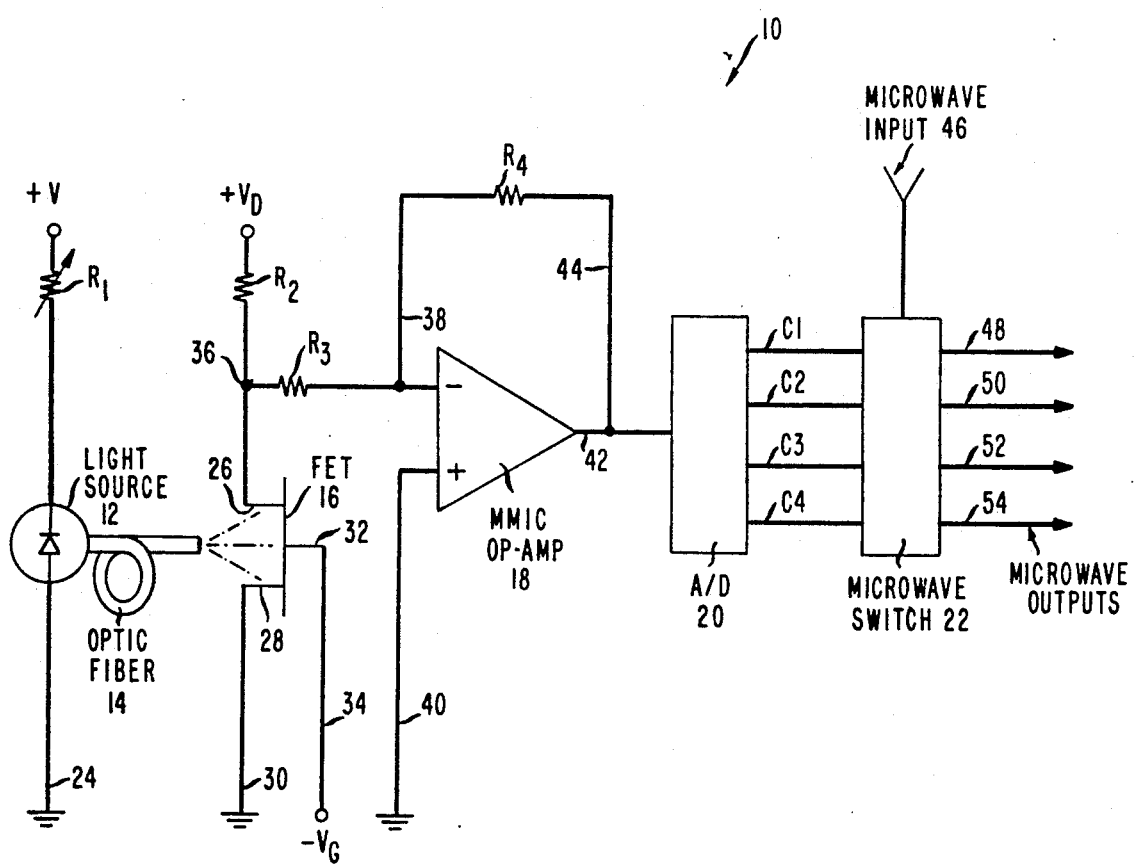

OPTICAL CONTROL OF A MICROWAVE SWITCH

GOVERNMENTAL INTEREST

The invention described herein may be manufactured, used, and licensed by or for the Government for governmental purposes without the payment to me of any royalty thereon.

FIELD OF THE INVENTION

The invention relates in general to an optical control of a multi-bit microwave switch, and particularly to an optical control of a 4-bit microwave switch.

BACKGROUND OF THE INVENTION

The prior art optical control is described in U.S. Pat. No. 4,859,965, issued Aug. 22, 1989. The prior art optical control includes a light source for emitting light at a wavelength in the region of 0.5 micrometers to 1 micrometer, control means coupled to said light source for controlling the intensity of the light emitted from said source, a fixed resistance, a GaAs multi-finger FET having parallel connected sources and parallel connected drains and parallel connected gate fingers, circuit means for connecting the sources and drains of said FET in series circuit with said fixed resistance across a source of positive dc voltage, optic fiber means optically coupled from said light source on the surface of said FET between the sources and drains of the FET and covering substantially all of the gate fingers of the FET, gate biasing means coupled to the gates of said FET for biasing said FET to a point near pinch-off to maximize the light sensitivity of the FET, dc amplifier means having an input coupled to a circuit junction of said fixed resistance and said FET and having an output, a GaAs MMIC distributed amplifier having a dc bias control coupled to the output of the dc amplifier means, whereby changes in the intensity of light from said light source change the voltage drop across said FET and the input applied to said dc amplifier means to thereby change the gain of said MMIC distributed amplifier.

One problem with the prior art optical control is that for an application for controlling a single pole-four throw, four bit microwave switch, each control signal or bit requires a separate fiber optic analog link, or four separate fiber optic analog links.

SUMMARY OF THE INVENTION

According to the present invention, an optical control of a four-bit microwave switch is provided. This optical control comprises, a light source for emitting light at a wavelength in the region of 0.5 micrometers to 1 micrometer, control means coupled to said light source for controlling the intensity of the light emitted from said source, a fixed resistance, a GaAs multi-finger FET having parallel connected sources and parallel connected drains and parallel connected gate fingers, circuit means for connecting the sources and drains of said FET in series circuit with said fixed resistance across a source of positive dc voltage, optic fiber mean optically coupled from said light source on the surface of said FET between the sources and drains of the FET and covering substantially all of the gate fingers of the FET, gate biasing means coupled to the gates of said FET for biasing said FET to a point near pinch-off to maximize the light sensitivity of the FET, dc amplifier means having an input coupled to a circuit junction of said fixed resistance and said FET and having an output, an analog to digital converter having an input coupled to the output of said dc amplifier means and having a plurality of outputs, a multi-bit microwave switch having a plurality of inputs respectively coupled through control lines to the outputs of the analog to digital converter and having a microwave input and having a plurality of microwave outputs, whereby changes in the intensity of light from said light source change the voltage drop across said FET and change the signal applied to said dc amplifier means and then change the signal applied to said analog to digital converter and then change the four bit digital word signal applied to said microwave switch to thereby change the microwave input routed to the four microwave outputs in a selective fashion.

By using the analog to digital converter with the arrangement described one fiber optic link can be used in place of four fiber optic analog links.

BRIEF DESCRIPTION OF THE DRAWING

These and other objects, features and details of the invention will become apparent in light of the ensuing detailed disclosure, and particularly in light of the drawings wherein:

The FIGURE is a schematic circuit diagram of the optical switch control circuit according to the present invention.

DESCRIPTION OF THE PREFERRED EMBODIMENT

As shown in the FIGURE, an optical switch control circuit or assembly or system 10 is provided. Circuit 10 includes a light source or LED 12, an optic fiber or cable 14, a gallium arsenide (GaAs) MESFET or microwave monolithic integrated circuit (MMIC) field effect transistor FET 16, and a gallium arsenide (GaAs) microwave monolithic integrated circuit (MMIC) operational amplifier 18. Circuit 10 also includes a GaAs or silicon bipolar analog to digital converter 20, and a four-bit, single pole, four throw, microwave switch 22.

Light source 12 should emit light at a wavelength in the region of 0.5 micrometers to 1 micrometers because light in this wavelength region is capable of altering the performance of a GaAs FET. As illustrated in the FIGURE, light source 12 may comprise a light emitting diode (LED), such as the pig-tailed LED manufactured by Laser Diode, Inc., No. IRE-160 FA, for example. This LED is capable of producing 300 microwatts of power at a wavelength of 835 nanometers. The intensity of the light from the LED 12 may be varied by a variable resistance $R_1$ which acts as the control means for the optical control circuit of the invention.

Light source 10 is connected in series circuit with variable resistance $R_1$ across a source of positive dc voltage by means of a lead 24.

Optic fiber 14 is optically coupled t LED light source 12 and to a FET, indicated generally as 16. If the aforementioned pig-tailed LED is utilized a the light source, the pig-tail itself is an optic fiber and may be used as the optic fiber 14 in the circuit of the invention. This fiber is a graded index fiber with a core diameter of 100 micrometers and a cladding diameter of 140 micrometers. The FET 16 should be a GaAs multi-finger FET having parallel connected sources, parallel connected drains and parallel connected gate fingers. A suitable FET, for example, would be NEC NE 868196 which has 14 gate fingers connected to a single gate bonding pad. The end of the optic finger 14 which is coupled to FET 16 should focus the light from the source 12 on the active surface of the FET 16 between the sources and drains of the FET and the focus light spot should cover substantially all of the gate fingers of the FET.

The parallel connected drains 26 and parallel connected sources 28 of the FET 16 are connected in series circuit with a fixed resistance $R_2$ across a source $V_D$ of positive dc voltage by means of a lead 30. The parallel connected gates 32 of the FET 16 are connected by a lead 34 to a source $V_G$ of negative dc voltage which should be of sufficient magnitude to bias the FET 16 to a point near pinch-off of the FET 16. Pinch-off is usually defined as the value of gate voltage that causes the drain current of the FET to be at 10% of its full value. This is done to maximize the light sensitivity of the FET 16 because it has been found that the maximum change in operating performance of a GaAs FET in response to light directed onto the surface of the FET occurs at a point at or near pinch-off.

The circuit junction 36 between the serially-connected FET 16 and the fixed resistance $R_2$ is connected by means of a resistance $R_3$ and a lead 38 to the negative input of a MMIC operational amplifier 18.

The operational amplifier 18 has its positive input connected to ground by means of a lead 40 so that the input signal applied to the operational amplifier through resistance $R_3$ is essentially the drain to source voltage of the FET 16. The output of the amplifier 18 is coupled in a feedback loop to its negative input by means of leads 42 and 44, resistance $R_4$ and lead 38 so that the gain of the amplifier 18 is determined by the resistance ratio $R_4/R_3/$. The amplifier 18 may comprise, for example, a GaAs MMIC operational amplifier such as No. AOP 1510 which is manufactured by Anadigics, Inc. This chip provides 70 dB of open loop gain and unity gain stable operation of 150 $MH_z$.

Analog to digital converter 20 is coupled at its input by lead 42 to the output of operational amplifier 18. The analog to digital converter 20 may comprise an analog to digital converter manufactured by Analog Devices, as Part No. AD 9688.

Microwave switch 22 is coupled at its input by four control lines or bits C1, C2, C3, C4, to the output of the analog to digital converter 20. Microwave switch 22 has a microwave input 46 and has four microwave outputs 48, 50, 52, 54. The microwave switch 22 may comprise a microwave switch manufactured by ANZAC, as part No. SW-114.

In operation, as the intensity of the light emitted from the LED 12 is changed by operation of the variable resistance $R_1$ or other control means, the number of photons striking the surface of the FET 16 is correspondingly changed so that the drain to source voltage drop across the FET 16 is also changed. Since the FET 16 and the fixed resistance $R_2$ are connected in series circuit across a fixed dc voltage source, they act as a voltage divider circuit so that the positive voltage appearing between circuit junction point 36 and ground changes in accordance with the change in light intensity. The operational amplifier 18 is connected in its inverter mode of operation so that its output signal is a negative voltage. The voltage change from the circuit junction point 36 is then amplified by MMIC op-amp 18 which has a voltage gain of about 10. The signal out of the op-amp 18 is now a function of the optical signal. The signal out of the op-amp 18 drives the analog to digital converter 20. The analog to digital converter 20 provides a four bit word that controls microwave switch 22, through the four control lines C1, C2, C3, and C4. The microwave input signal is routed to the four outputs 48, 50, 52, 54, depending on the control signals. The channel the microwave signal is switched to is now a function of the optical signal.

The advantages of circuit 10 are indicated hereafter.

A) The problem of the prior art optical control of using four optical control analog links for providing four separate signals to a single pole four throw microwave switch is avoided by instead using the single optical control link 10 of the invention.

B) The circuit 10 of the invention is provided which controls a microwave switch optically using all GaAs MMIC compatible technology.

C) The circuit 10 of the invention can be used for remotely controlling a microwave switch in a relatively high interference environment.

D) The circuit 10 can be used to control a microwave switch which requires two or more control signals using a single fiber optic link.

While the invention has been described in its preferred embodiment, it is to be understood that the words which have been used are words of description rather than limitation and that changes may be made within the purview of the appended claims without departing from the true scope and spirit of the invention in its broader aspects.

For example, the LED light source 12 can be replaced by a high speed laser for faster switching. The four bit microwave switch 22 can be a switch of 2 through 5 bits depending on the number of channels served.

What is claimed is:

1. An optical switch control circuit comprising:
a light source for emitting light at a wavelength in the region of 0.5 micrometers to 1.0 micrometer;
control means coupled to said light source for controlling the intensity of the light emitted from said source;
a fixed resistance;
a GaAs multi-finger FET having parallel connected sources and parallel connected drains and parallel connected gate fingers;
circuit means for connecting the sources and drains of said FET in series circuit with said fixed resistance across a source of positive, dc voltage;
means optically coupled from said light source on the surface of said FET between the sources and drains of the FET and covering substantially all of the gate fingers of the FET;
gate biasing means coupled to the gates of said FET for biasing said FET to a point near pinch-off to maximize the light sensitivity of the FET;
dc amplifier means having an input coupled to a circuit junction of said fixed resistance and said FET and having an output;
an analog to digital converter coupled at its input to the output of said dc amplifier means and having a plurality of outputs; and
a multi-bit microwave switch having a plurality of inputs respectively coupled through respective control lines to the outputs of the analog to digital converter and having a microwave input and having a plurality of microwave outputs;
whereby changes in the intensity of light from said light source change the voltage drop across said FET and change the signal applied to said dc amplifier means and then change the signal applied to said analog to digital converter and then change the multi-bit word signal applied to said microwave switch to thereby change the microwave input routed to the microwave outputs in a selective fashion.

2. The optical switch control circuit of claim 1, wherein said multi-bit microwave switch is a 4-bit microwave switch.

3. The optical switch control circuit of claim 1, wherein said means optically coupled to said light source and said FET for focussing light from said light source on the surface of said FET is an optic fiber.

4. The optical switch control circuit of claim 1, wherein said light source is a LED.

5. The optical switch control circuit of claim 1, wherein said light source is a laser.

* * * * *